United States Patent [19]

Giles

[11] 3,843,934

[45] Oct. 22, 1974

[54] HIGH SPEED TRANSISTOR DIFFERENCE AMPLIFIER

[75] Inventor: James N. Giles, San Jose, Calif.

[73] Assignee: Advanced Micro Devices, Inc., Sunnyvale, Calif.

[22] Filed: Jan. 31, 1973

[21] Appl. No.: 328,417

[52] U.S. Cl. .................... 330/30 D, 330/20, 330/26
[51] Int. Cl. .............................................. H03f 3/68
[58] Field of Search ................ 330/20, 26, 30 D, 69

[56] References Cited

UNITED STATES PATENTS

| | | | |
|---|---|---|---|
| 3,684,971 | 8/1972 | Winker | 330/69 X |
| 3,760,194 | 9/1973 | Lutz et al. | 330/30 D X |

*Primary Examiner*—James B. Mullins
*Attorney, Agent, or Firm*—Jerald E. Rosenblum, Esq.; Thomas Schneck, Esq.

[57] ABSTRACT

A high speed, high input impedance difference amplifier in which a symmetric two branched circuit has opposed matched input transistors. An input signal into the matched input transistors appears again at the output electrodes for subsequent amplification. A pair of transistors cross coupling the circuit branches performs part of this amplification, while keeping interelectrode capacitance in each branch to a minimum since the cross coupling transistors may be operated at a high current level without affecting input impedance.

2 Claims, 3 Drawing Figures

HIGH SPEED TRANSISTOR DIFFERENCE AMPLIFIER

BACKGROUND OF THE INVENTION

The invention pertains to difference amplifiers and more particularly to a transistor difference amplifier circuit that has both high input impedance and high speed characteristics.

Difference or differential amplifiers are used to amplify the difference between two analog signals which are simultaneously applied to the amplifiers. When difference amplifiers have a sufficiently high gain, they may be used as comparators, i.e., circuits which indicate by a digital output signal whether the difference between two input signals is positive or negative. One problem with comparators, and difference amplifiers generally, is their limitation with respect to speed.

In applications where it is desired to provide a high input impedance to the difference amplifier, the common practice is to add a pair of transistors to the input stage connected in the "Darlington connection." The limit on speed for this circuit results from electrode capacitance appearing at the emitters of the outboard transistors of the Darlington pair. The Darlington cannot respond to large, fast input signals (positive-going for PNP transistors or negative-going for NPN transistors) because the capacitance must be discharged through a high impedance. Bleeder resistors or current sources may be provided to discharge the capacitance, but this dissipates additional power and does not completely eliminate the problem. The extra current drawn through the resistors also reduces the input impedance.

Another problem of simple common-emitter gain stages at high frequencies is that the collector to base feedback capacitance is multiplied by the voltage gain of the stage (Miller effect). This problem also exists with Darlington connected stages.

It is, therefore, the object of the present invention to increase the input impedance of difference amplifiers without degrading the speed.

A further object is to provide a high speed difference amplifier which because of symmetry properties lends itself to fabrication by integrated circuit technology.

Still another object is to build a high speed difference amplifier in which a latch is provided.

SUMMARY OF THE INVENTION

In a two-branch transistor difference amplifier wherein each branch includes two transistors connected in a high isolation input and output configuration (cascode), I have discovered that by selecting well-matched transistors for the transistor pair in each branch, the voltage signal that is applied across the input electrodes of the first and second branches will also appear across the two branches at the output electrodes of the first transistor in each branch. A pair of transistors can now be added cross-connecting the two circuit branches from the point at which the input signal appears across the branches to the output stage of the opposite branch. Since the transistor pair interconnecting the two branches is effectively in parallel with the first transistors in each branch the current amplification from the four transistors, two in each branch, is combined. Any power which was formerly wasted in bleeder resistors to discharge capacitance is now used for signal amplification. The ratio of operating currents of the added transistor pair to the input transistor pair can be made relatively large, thus allowing a high input impedance to be achieved. However, there is no longer any problem of discharging capacitance through high impedances, and the use of the cascode connection eliminates the "Miller" effect.

DESCRIPTION OF THE PREFERRED EMBODIMENT

Figure 1:
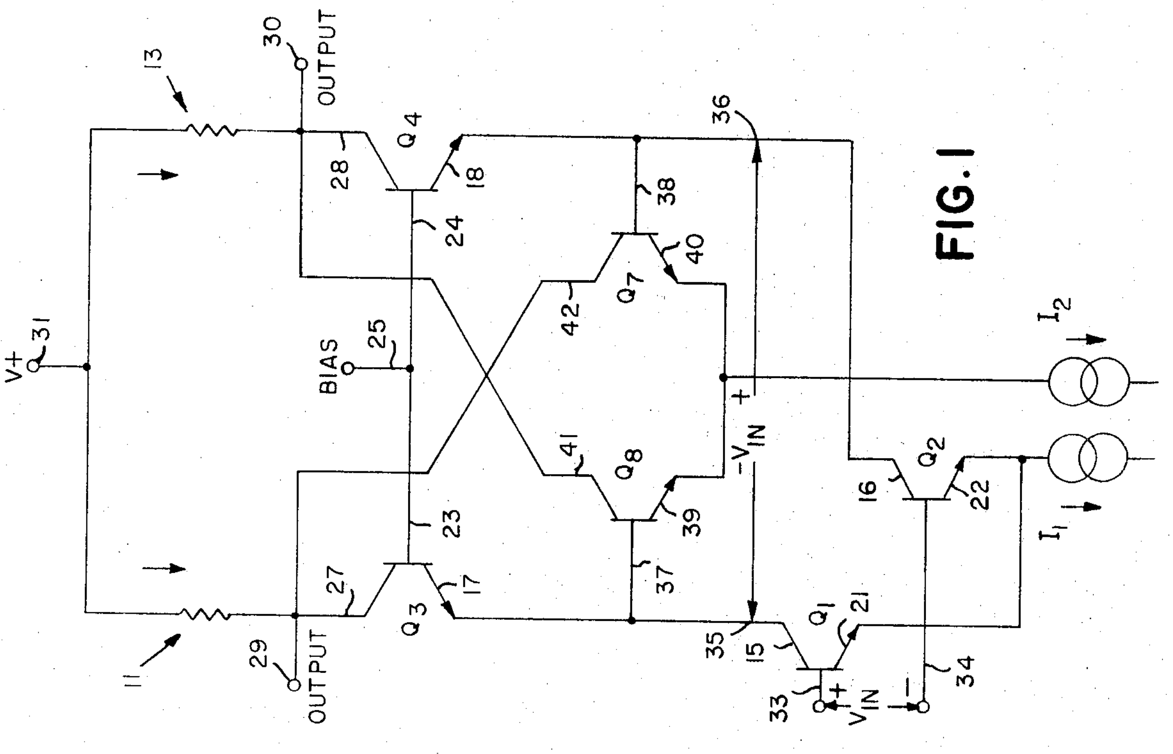
FIG. 1 is a schematic diagram of a two-branch difference amplifier with a pair of transistors in each branch arranged in a cascode configuration.

FIG. 1 shows a schematic diagram of a two-branch circuit wherein the first transistor Q1 and the second transistor Q3 of the left-hand side branch 11 are connected in cascode, as are Q2 and Q4, of the right-hand side branch 13, both Q1 and Q2, and Q3 and Q4, being matched transistor pairs. The cascode connection provides good isolation between input and output stages. Specifically, the output electrode of Q1, the collector, 15, is connected to the input electrode, the emitter 17, of Q3. The first and second transistors, Q2 and Q4, of the right-hand side branch, 13, are similarly connected. Q1 and Q2 are a matched pair; Q3 and Q4 are a matched pair; but Q1 and Q3 do not have to be matched to each other. By matched transistor pair is meant that the transistors have almost identical performance characteristics under equal given conditions. In integrated circuit fabrication, matched transistor pairs are possible to make when made in the same processing steps.

The common electrodes, 21 and 22, of the first transistors Q1 and Q2 of each branch are connected together. A current source, I1, is connected to the common connection. While a current source is needed to operate both branches of the circuit, the current source need not be part of the circuit. For example, the current source may be part of an external power supply.

The common electrodes 23 and 24 of the second transistors Q3 and Q4 of each branch are connected together and a bias connection 25 is provided to the common connection. The collectors of the second transistors 27 and 28 are signal output electrodes which are connected to respective first and second output terminal means, such as conventional connectors, 29 and 30. A supply voltage 31 is connected across circuit branches 11 and 13.

The input signal for the circuit of FIG. 1 is applied to signal input electrodes, the bases, 33, 34 of transistors Q1 and Q2. Now since Q1 and Q3 are connected in series and also are Q2 and Q4, the current through the first transistors in each branch is equal to the current in the second transistors of the respective branch. Since Q1 and Q2 are a matched pair, and Q3 and Q4 are a matched pair, the difference in base-emitter voltages of the first and second transistors in each branch must be equal. Hence, the voltage appearing across the bases, 33, 34 of the first transistors of each branch, the input voltage, is equal to the voltage across the emitters 17, 18 of the second transistors. The input voltage thus appears across the two branches of the circuit between the first and second transistor of each branch as indicated by the arrow 35, 36.

Across the two branches of the circuit where the input voltage signal $V_{in}$ is reproduced, another pair of transistors, termed third and fourth transistors, Q7 and Q8, is cross-connected. Transistors Q7 and Q8 each have a signal input electrode, a base, 37, 38 symmetrically connected to a respective branch between transistors Q2 and Q4 for the right branch 13 and between transistors Q1 and Q3 for the left branch 11. Transistors Q7 and Q8 have mutually common electrodes, emitters, 39, 40, to which a current source is connected. The transistors Q7 and Q8 also have output electrodes, collectors, connected to the branch opposite to which the respective input electrode is connected.

Since the input electrodes, 33, 37 of Q1 and Q8 on the left-hand branch and of the input electrodes, 34, 38 of Q2 and Q7 on the right-hand branch see the same input signal, $V_{in}$, Q7 and Q8 function as though they were connected in parallel with Q1 and Q2 as far as the amplification of the input signal is concerned. Yet since Q7 and Q8 are isolated from the input terminals, they may be operated at an arbitrary current level without affecting the input impedance.

A first current source I1 is connected to the common electrodes of the transistors Q1 and Q2. A second current source I2 is connected to the common electrodes of transistors Q7 and Q8. The input current source, I1 can be made quite low, in order to achieve a low input bias current as with a Darlington, and I2 can be many times larger to develop the total gain and total operating current required for best frequency response. This can be quite useful as an input stage for a high slew rate operational amplifier, voltage follower, or sample and hold amplifier, for example.

The collectors of Q7 and Q8 may be connected to the collectors of Q3 and Q4 as shown in FIG. 1, or, for even better high frequency performance, may be alternatively connected to the emitters of Q3 and Q4. This removes their collector capacitance from the load resistors and transfers it to the low impedance emitter nodes where the signal swing is low. To further isolate the functions, multiple emitters may be used for Q3 and Q4.

The usefulness and versatility of a comparator can be enhanced by adding a latch function to the circuit. A latch locks the output in the logic state it was in at the instant the latch was enabled. The latch can thus perform a sample and hold function, allowing short input signals to be detected and held for further processing. If the latch is designed to operate directly upon the input stage — so the signal does not suffer any additional delays — signals only a few nanoseconds wide can be acquired and held.

Figure 2:
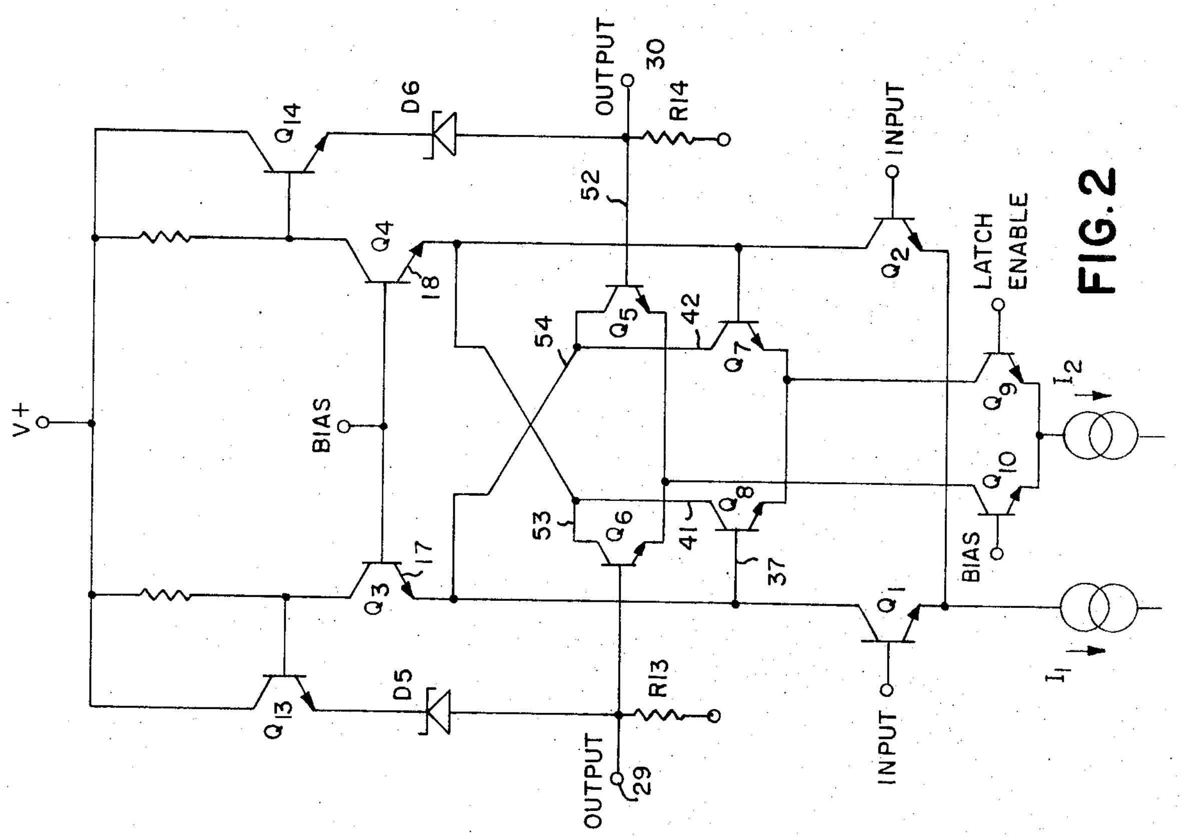
FIG. 2 is a schematic diagram of a two-branch difference amplifier with a pair of transistors in each branch arranged in a cascode configuration and further including a latch circuit.

FIG. 2 shows the difference amplifier of FIG. 1 with a latch formed by the transistors Q5 and Q6.

Transistors Q6 and Q5 have their collectors 53, 54 connected to the emitters 18, 17 of transistors Q4 and Q3 and to collectors 41, 42 of transistors Q8, Q7. The current source I2 is switched on to enable the latch via Q9 and Q10. If I2 is greater than I1 the positive feedback through Q5 and Q6 will hold the difference amplifier in whatever state it was when the latch was turned on. The bases 51, 52 of transistors Q6 and Q5 are connected to respective outputs 29 and 30 for this purpose.

The transistors Q9 and Q10 serve as a switch for current source I2. In an ordinary difference amplifier, without Q7 and Q8, but with a positive feedback latch, the current should be slightly greater than the input source current from I1 to assure positive latching for any input signal. For example, if the difference amplifier input required 5 mA., at least 6mA. would be required to power the latch. However, with Q7 and Q8, an amplifier requiring 5mA. could derive 3mA. through source I1 when transistor Q9 is switched on by a positive signal since the 3mA. are provided to third and fourth transistors Q7 and Q8. No current is used in the latch. When the latch is again switched by a negative signal, current from source I2 is switched through Q10 to latch transistors Q5 and Q6, depriving the gain stages of 3mA. and giving it to the latch. Thus the total current required is only 5mA., including the current to operate the latch.

In order to interface properly with succeeding stages of a complete amplifier, the output level of the cascode arrangement is shifted by an output pair of zener diodes D5, D6 associated with an output terminal on each branch of the circuit with an emitter follower buffer Q13, Q14 between the output electrode of the second transistor in each branch and the respective output terminal. To supply the proper reference for a given logic level the current sources I1 and I2 are transistors compensated for temperature and power supply variations.

Figure 3:
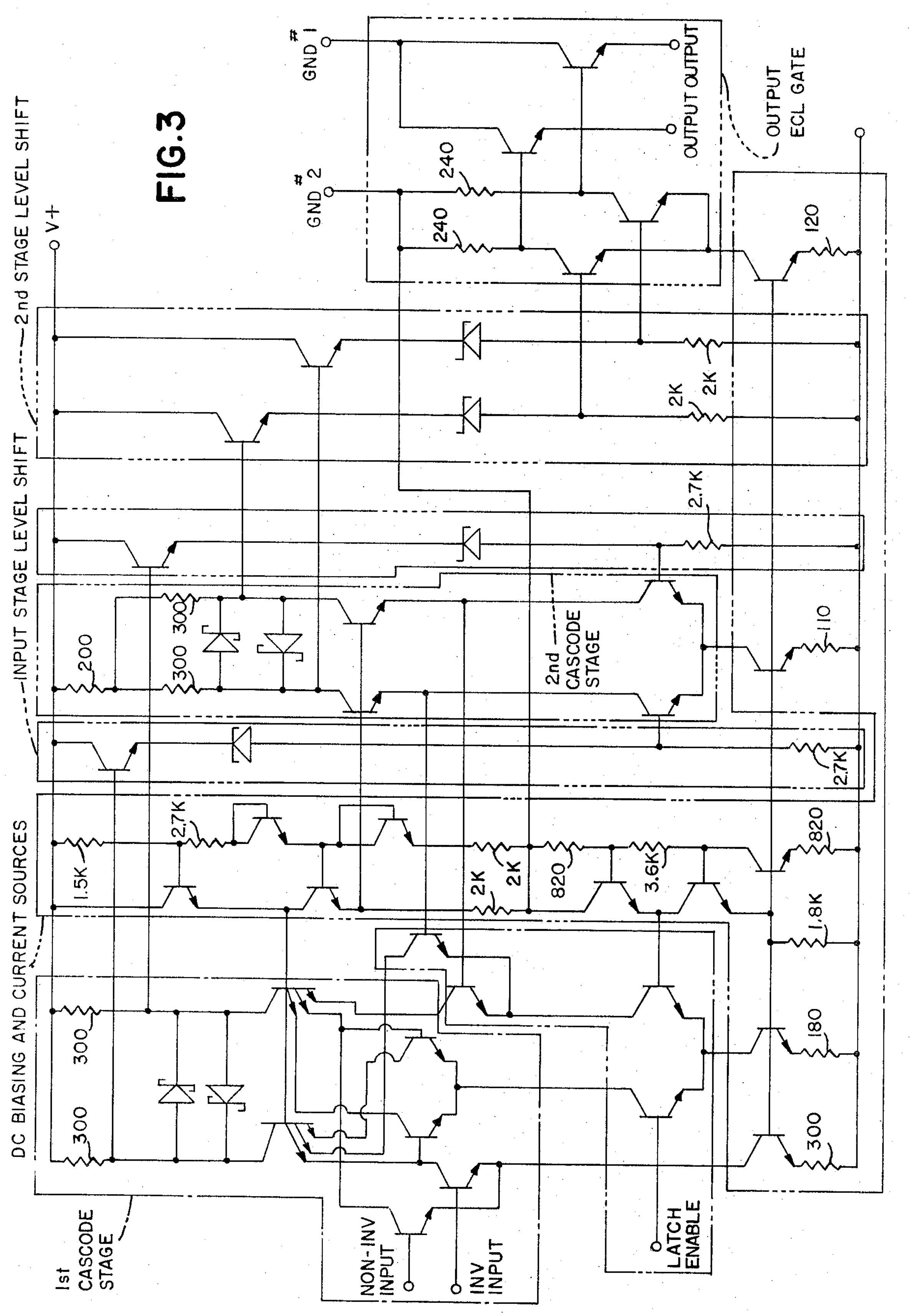
FIG. 3 is a schematic diagram of a complete two-branch difference amplifier intended for comparator applications, shown with bias and current sources.

FIG. 3 shows an example of practical circuit built using the principles of the invention. This particular example is of a high-speed comparator designed to interface with ECL-type digital logic. The basic circuit of the present invention is shown in the left-hand side of FIG. 3 and is tagged "cascode stage," as an abbreviated circuit designation. Other parts of the circuit, such as "latch enable" and "d.c. biasing and current sources" are similarly labeled.

I claim:

1. A high speed transistor differential amplifier comprising, first and second symmetric circuit branches, each having respective first and second transistors connected in series in a high input-output isolation configuration, each of said transistors having a signal input electrode, a signal output electrode and a common electrode; said first and second transistors connected with a signal output electrode of each first transistor connected to the signal input electrode of each second transistor, a pair of input terminal means for connecting an input signal across respective signal input electrodes of the first transistors of each branch, means for producing said input signal across said first and second circuit branches between said first and second transistors, a first cross-connected pair of transistors, each of said transistors having a signal input electrode connected to a respective branch between said first and second transistors and each having a respective output electrode connected to an electrode of the second transistor of the branch opposite to which the respective input electrode is connected, a pair of output terminals, each associated with a respective circuit branch, and a latch means connected to said first and second circuit branches for maintaining the output of said circuit in a stable condition, said latch means comprising a second cross-connected pair of transistors, each of said transistors having a first electrode connected to one of said output terminals, and a second electrode connected to a circuit branch opposite said first electrode, between said first and second transistors, thereby providing positive feedback from an output terminal to a respective circuit branch.

2. The apparatus of claim 1 wherein said transistors are all of the same conductivity type.

* * * * *